United States Patent [19]

Fujioka et al.

[11] Patent Number: 5,047,924
[45] Date of Patent: Sep. 10, 1991

[54] MICROCOMPUTER

[75] Inventors: Shuzo Fujioka; Toshiyuki Matsubara; Atsuo Yamaguchi; Kenichi Takahira; Shigeru Furuta; Takesi Inoue, all of Itami, Japan

[73] Assignee: Mitsubishi Denki Kabushiki Kaisha, Japan

[21] Appl. No.: 279,029

[22] Filed: Dec. 2, 1988

[51] Int. Cl.⁵ .............................................. G06F 1/04
[52] U.S. Cl. ................................. 364/200; 364/232.8; 364/258.3; 364/270.2
[58] Field of Search ................................ 364/200, 900

[56] References Cited

U.S. PATENT DOCUMENTS

| | | | |
|---|---|---|---|
| 4,130,866 | 12/1978 | Ono | 364/200 |
| 4,364,112 | 12/1982 | Onodera et al. | 364/200 |
| 4,523,274 | 6/1985 | Fukunaga et al. | 364/200 |
| 4,947,411 | 8/1990 | Shiraishi et al. | 364/200 |
| 4,958,276 | 9/1990 | Kiuchi et al. | 364/200 |

OTHER PUBLICATIONS

Nikkei Electronics: May 24, 1982.

Primary Examiner—Michael R. Fleming
Assistant Examiner—Debra A. Chun
Attorney, Agent, or Firm—Leydig, Voit & Mayer

[57] ABSTRACT

A microcomputer comprises EEPROM provided as a fixed storage unit and a CPU for controlling the operation of the EEPROM, in which the EEPROM contains a divider which divides a stable clock signal from the outside of the microcomputer and converts it to a clock signal with a desired frequency, the clock signal is used as a synchronizing signal necessary for the writing data into the EEPROM. The CPU controls the operation of the EEPROM and sets the dividing ratio of the divider contained in the EEPROM at a desired value in accordance with the assignment from the outside of the microcomputer.

2 Claims, 3 Drawing Sheets

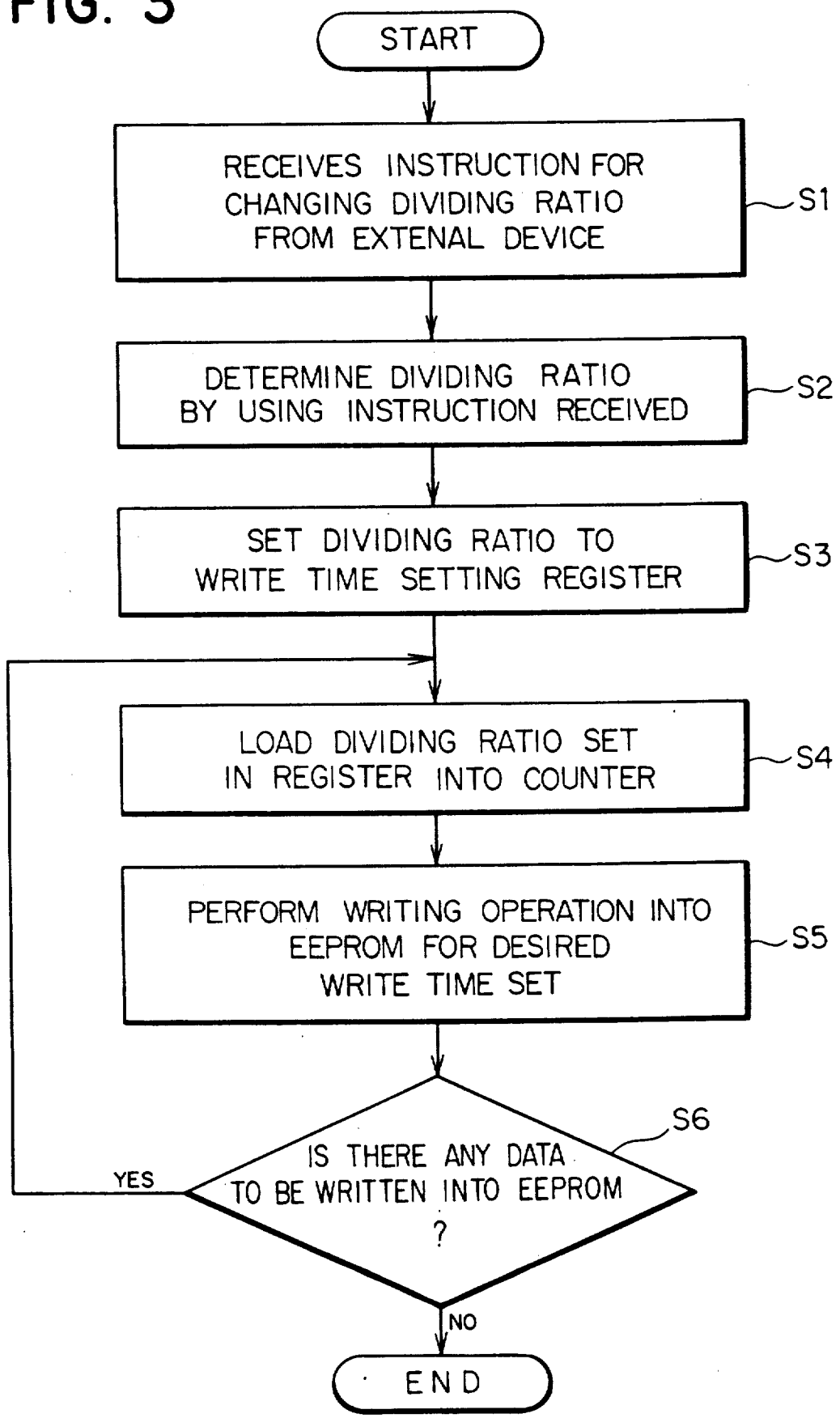

MICROCOMPUTER

BACKGROUND OF THE INVENTION

The present invention relates to a microcomputer contained in an IC card or the like, and particularly to a clock signal for writing in EEPROM provided as a memory unit in a microcomputer.

Writing in EEPROM generally requires a clock signal in order to obtain synchronism, and writing of data etc. is performed synchronously with this write clock signal. Some conventional EEPROMs contain oscillating circuits for the write clock signal. The time spent writing in EEPROM depends upon the frequency of the clock signal output from such a oscillating circuit. FIG. 4 is a schematic block diagram of the configuration of a conventional microcomputer which contains EEPROM having an oscillating circuit and divider and which is incorporated in an IC card or the like. In FIG. 4, a microcomputer module 10 comprises a CPU 1 serving as a processing unit and EEPROM 2 serving as a fixed memory unit. The CPU 1 is shown as a unit having a processing function and containing an ALU, a register, a counter, memory (none of which are shown in the drawing) and the like which are required for processing. The CPU 1 delivers data to the outside thereof through a data input and output bus 3a and receives a clock signal from the outside through a clock signal line 3b. The EEPROM 2 contains a storage unit 2a comprising a memory array, a control circuit necessary for writing data in the memory array and a latch circuit (none of which are shown in the drawing), an oscillating circuit 2b for oscillating a clock signal with a natural frequency and a divider 2c for dividing the clock signal oscillated by the oscillating circuit 2b to convert the clock signal to a clock signal with a given frequency. The CPU 1 and the EEPROM 2 are connected by a control bus 4, an address bus 5 and a data bus 6. The clock signal divided by the divider 2c is sent to the storage unit 2a through a clock signal line 2d.

In this EEPROM 2, the clock signal generated by the oscillating circuit 2b contained therein is divided with a given ratio by the divider 2c so that data is written synchronously with the clock signal divided.

Although the conventional microcomputer is configured as described above, dispersion occurs during data writing because the clock signal generated by the oscillating circuit contained in EEPROM is generally unstable. It is therefore necessary to set a value in the divider so that the minimum value of dispersion of the writing time satisfies the writing time. There is thus the problem that it is necessary to set a longer time than the time required for the actual writing, resulting in a long write time.

SUMMARY OF THE INVENTION

The present invention has been achieved with a view to solving the above-described problem. It is an object of the present invention to provide a microcomputer in which the EEPROM contains no oscillating circuit but a divider for dividing a more stable clock signal that is input to EEPROM from the outside of the microcomputer so that the divided clock signal is used as a clock signal for writing in the EEPROM, allowing the dividing ratio of the divider to be freely changed through the CPU from the outside of the microcomputer so that a desired write time can be set.

In consideration of the aforementioned object, the present invention provides a microcomputer comprising EEPROM provided as a fixed storage unit and a CPU for controlling the operation of the EEPROM, in which the EEPROM contains a divider which divides a stable clock signal from the outside of the microcomputer and converts it to a clock signal with a desired frequency for the purpose of obtaining a clock signal which has the desired frequency, the clock signal being used as a synchronizing signal necessary for the writing operation, and the CPU controls the operation of the EEPROM, as well as setting the dividing ratio of the divider contained in the EEPROM at a desired value in accordance with the assignment from the outside of the microcomputer.

Another aspect of the present invention lies in an IC card containing the above-described microcomputer.

In the microcomputer of the present invention, the EEPROM contains the divider but no oscillating circuit. The stable clock signal is input in the EEPROM from the outside thereof and is divided and converted to a clock signal with a desired frequency by the divider contained therein so as to be used as a write clock signal. The dividing ratio of the divider is controlled by the CPU in accordance with the assignment from the outside of the microcomputer.

BRIEF DESCRIPTION OF THE DRAWINGS

FIG. 3 is a flowchart of the control program involving the operation of setting a dividing ratio; it is stored in the CPU.

DETAILED DESCRIPTION OF PREFERRED EMBODIMENT

An embodiment of the present invention is described below with reference to the attached drawings.

Figure 1:
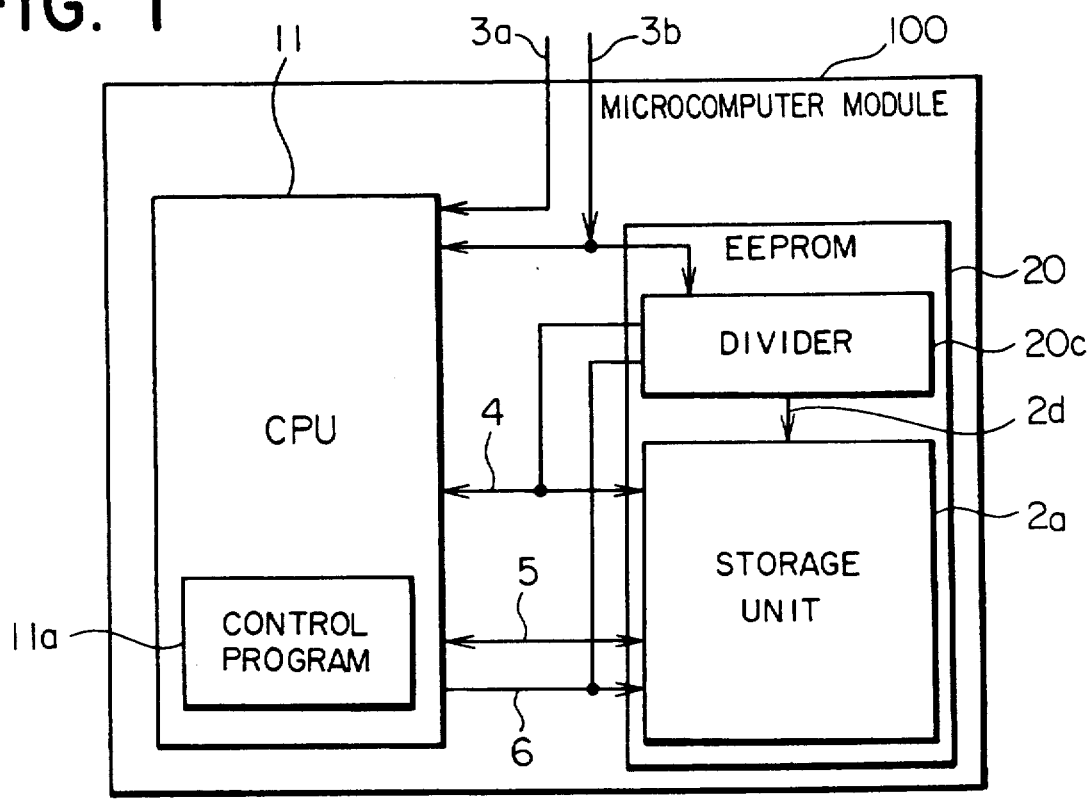
FIG. 1 is a schematic block diagram of the configuration of a microcomputer that is an embodiment of the present invention.
Figure 4:
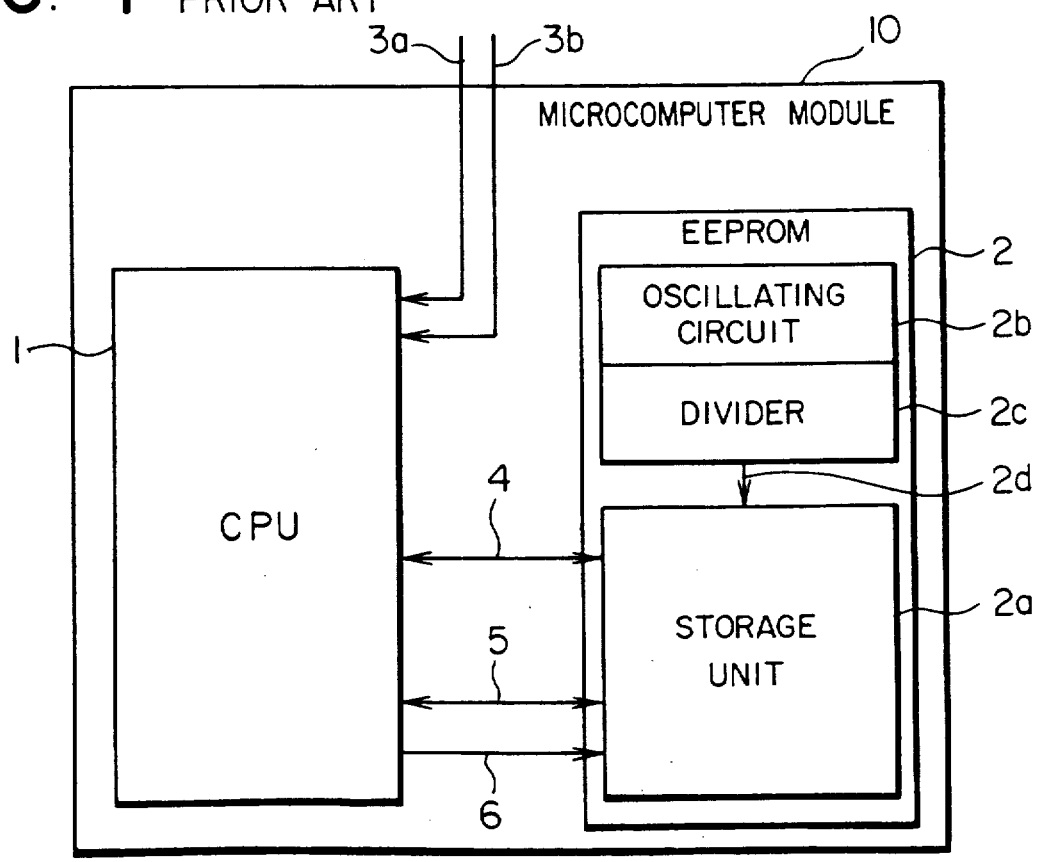
FIG. 4 is a schematic block diagram of the configuration of a conventional microcomputer.

FIG. 1 is a schematic block diagram of an embodiment of the microcomputer of the present invention. A microcomputer module 100 comprises a CPU 11 serving as a processing unit and EEPROM 20 serving as a fixed memory unit. In the same way as in a conventional CPU, the CPU 11 is shown as a unit which contains ALU, a register, a counter, memory (none of which are shown in the drawing) and the like and which has a processing function. The CPU 11 delivers data to the outside through a data input and output bus 3a and receives a stable clock signal from the outside through a clock signal line b. The EEPROM 20 comprises a storage unit 2a containing a memory cell array, a control circuit necessary for writing data in the memory cell array and a latch circuit (none of which are shown in the drawing) and so on, and a divider for dividing the stable clock signal obtained from the outside through the clock signal line 3b with a desired dividing ratio. The clock signal with a desired frequency divided by the divider 20c is sent to the storage unit 20 through a clock signal line 2d. The CPU 11 and EEPROM 20 are connected by a control bus 4, an address bus 5 and a data bus 6. The dividing ratio of the divider 20c contained in the EEPROM 20 is assigned to the CPU 11 from the outside through the data input and output bus 3a so that the CPU 11 recognizes the assignment and sets the dividing ratio in the divider 20c through the data bus 6. The setting of the dividing ratio of the divider 20c is performed by a control program 11a which was previously stored in the memory of the CPU 11 and which includes the operation of setting the dividing ratio.

Figure 2:
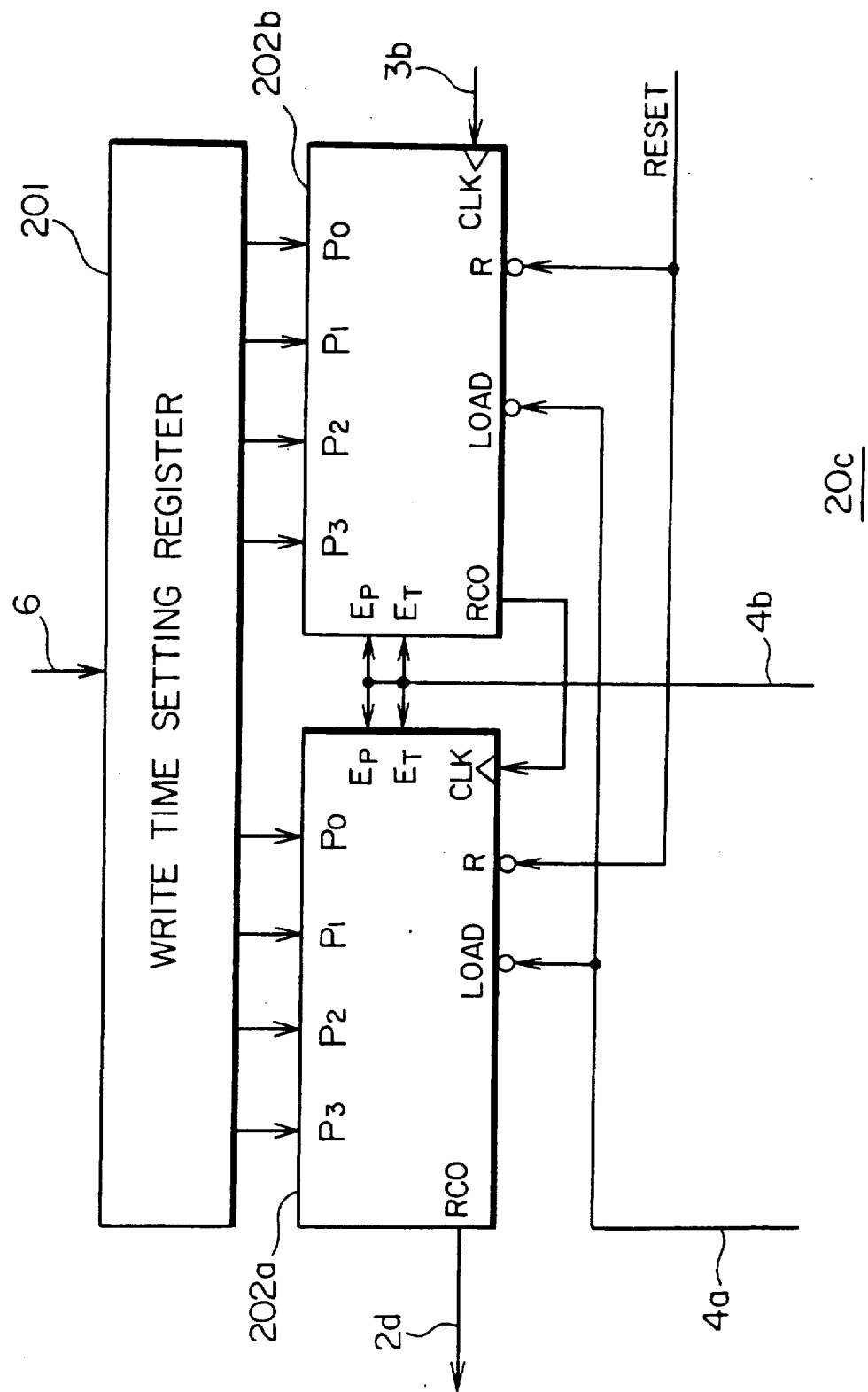
FIG. 2 is a block diagram of an embodiment of the configuration of the circuit of the divider shown in FIG. 1.

FIG. 2 shows a block diagram of the configuration of the circuit of an embodiment of the divider 20c. In FIG. 2, the divider 20c comprises a write time setting register 201 and two counters 202a and 202b. Each of these two counters 202a and 202b may have the same function as that of, for example, a Mitsubishi integrated circuit (LSTTL)M74LS161AP. The two counters 202a and 202b are connected to each other in series and each has a clock input terminal CLK, a carry output terminal RCO, four program input terminals $P_0$ to $P_3$ which receive the program signals for setting the dividing ratio from the write time setting register 201, enable input terminals $E_P$, $E_T$, a load input terminal LOAD and a direct-coupled reset input terminal R. The clock signal from the outside is passed through the clock signal line 3b and input in the clock input terminal CLK of the counter 202b. The clock signal is then divided by each of the two counters 202a and 202b with the dividing ratios respectively set therein, passed through the clock signal line 2d from the carry output terminal RCO of the dividing block 202a, and sent to the storage unit 2a (refer to FIG. 1). The data used for setting the dividing ratio from the CPU 11 is set in the write time setting register 201 over the data bus 6. Control signals from the CPU 11 such as a load signal 4a which is input to the load input terminal LOAD, an enable signal 4b which is input to the enable input terminals $E_P$, $E_T$, a reset signal RESET that is input to the direct-coupled reset input terminal R and so on are sent over the control bus.

When an instruction is produced by the CPU 11 for the EEPROM 20 in the state wherein a desired write time is set in the write time setting register 201, the load signal 4a is input so that the contents of the write time setting register 201 are loaded into the counters 202a, 202b through the program input terminals $P_0$ to $P_3$, and an instruction to start counting is generated by the enable signal 4b. As a result, writing operation in the storage unit 2a is started and then stopped when a signal indicating overflow is output from the carry output terminal RCO of the counter 202a through the clock signal line 2d. The reset signal RESET which is input to the direct-coupled reset input terminal R of each of the counters 202a, 202b is common to that for the CPU 11. FIG. 2 also shows the function of the embodiment of the configuration of the circuit of the divider. A circuit with such a configuration may be combined with the storage unit 2a.

FIG. 3 is a flowchart of the control program 11a which was previously stored in the memory of the CPU 11 and which includes the operation of setting the dividing ratio. When the CPU 11 first receives an instruction to change the dividing ratio from the outside thereof (Step S1), the operation of determining the dividing ratio to be set to the write time setting register 201 of the divider 20c is performed using the instruction received (Step S2). The dividing ratio is then set to the write time setting register 201 through the data bus 6 (Step 3). The dividing ratio set in the register 201 is loaded in the counters 202a, 202b by control through the control bus 4 (Step 4), and writing into the storage unit 2a of the EEPROM 20 is performed for the desired write time set (Step 5). The operations in Step S4 and Step S5 are repeated until no data to be written is left (Step 6). Although not shown in the drawing, when no instruction to change the dividing ratio is generated from the outside, Steps S1 to S3 are not executed, and the usual writing operation is performed.

The above-described embodiment can be brought into practical use in microcomputers used for any applications, for example, the embodiment can be used in microcomputers contained in IC cards.

As described above, since the present invention obtains a clock signal required for writing into the EEPROM by dividing a stable clock signal without any dispersion from the outside thereof, the EEPROM 20 need not contain any oscillating circuit, and thus a space corresponding to the oscillating circuit can be removed. In addition, since there is no dispersion in the write time, the write time need not be set with a certain margin. Therefore, the speed of the writing operation can be increased, i.e., the write time can be reduced, as compared with conventional microcomputers. And the reliability of the writing operation in the EEPROM is increased. Furthermore, since the dividing ratio of the divider contained in the microcomputer can be set to any desired value, there is an effect that a clock signal with a desired frequency can always be obtained by changing the dividing ratio of the divider even if the frequency of the clock signal from the outside is changed.

What is claimed is:

1. A microcomputer comprising:
    a divider which divides a clock signal originating from outside the microcomputer and changes the frequency of the clock signal to a desired frequency thereby creating a synchronizing signal;
    a storage unit connected to said divider having a memory cell array and a control circuit which writes data in the memory cell array responsive to the synchronizing signal from said divider;
    a CPU connected to said divider and said storage unit which includes a control program that sets the dividing ratio of the divider;
    said divider having:
        a write time setting register which receives a dividing ratio from a CPU;
        a first counter adapted to receive a clock signal from outside of the microcomputer; and
        a second counter serially connected with said first counter and adapted to receive a carry output from said first counter as a clock signal;
        said first and second counters being constructed to receive the dividing ratio from said write time setting register and to divide the clock signal according to the dividing ratio set in said first and second counters.
2. A microcomputer according to claim 1, wherein said microcomputer is contained in an IC card.

* * * * *